United States Patent [19]
Wu et al.

[11] Patent Number: 5,863,826
[45] Date of Patent: Jan. 26, 1999

[54] CMOS ISOLATION UTILIZING ENHANCED OXIDATION OF RECESSED POROUS SILICON FORMED BY LIGHT ION IMPLANTATION

[75] Inventors: Zhiqiang Jeff Wu; Li Li, both of Meridian, Id.

[73] Assignee: Micron Technology, Inc., Boise, Id.

[21] Appl. No.: 691,571

[22] Filed: Aug. 2, 1996

[51] Int. Cl.$^6$ .................................................. H01L 21/76
[52] U.S. Cl. ..................... 438/423; 438/441; 438/466; 438/960
[58] Field of Search .................................. 438/441, 466, 438/423, 229, 232

[56] References Cited

U.S. PATENT DOCUMENTS

| | | |
|---|---|---|
| 3,640,806 | 2/1972 | Watanabe et al. . |
| 3,919,060 | 11/1975 | Pogge et al. . |
| 3,962,052 | 6/1976 | Abbas et al. . |
| 4,016,017 | 4/1977 | Aboaf et al. . |
| 4,096,619 | 6/1978 | Cook, Jr. . |
| 4,180,416 | 12/1979 | Brock . |
| 4,764,248 | 8/1988 | Bhattacherjee et al. . |
| 5,156,896 | 10/1992 | Katoh et al. . |
| 5,159,428 | 10/1992 | Rao et al. . |
| 5,260,229 | 11/1993 | Hodges et al. . |
| 5,294,563 | 3/1994 | Rao . |
| 5,298,451 | 3/1994 | Rao . |
| 5,358,894 | 10/1994 | Fazan et al. . |
| 5,369,051 | 11/1994 | Rao et al. . |

OTHER PUBLICATIONS

Wolf, S., et al., Silicon Processing for the VLSI Era, vol. 1: Process Techonology, Lattice Press, pp. 323–327, 1986.

Teng., T.C. "An Investigation. . . Integrated Circuits", J. Electrochem. Soc: Solid State Science & Technology, May 1979, pp. 870–874, 1979.

V. Raineri, S. U. Campisano, *Silicon–on–insulator produced by helium implantation and thermal oxidation*, Appl. Phys, Lett. 66 (26), 26 Jun. 1995, pp. 3654–3656.

J.S. Logan, V. Platter and G. C. Schwartz, *Method of Etching/Filling Deep Trench Isolation for Large–Scale Integrated Devices*, IBM Technical Disclosure Bulletin, vol. 21 No. 4, Sep. 1978, pp. 1466 & 1467.

J. W. Lutze, A.H. Perera, and J. P. Krusius, *Field Oxide Thinning in Poly Buffer LOCOS Isolation with Active Area Spacings to 0.1:m*, J. Electrochem, Soc., vol. 137, No. 6, Jun. 1990, pp. 1867–1870.

*Primary Examiner*—George R. Fourson
*Attorney, Agent, or Firm*—Knobbe, Martens, Olson & Bear, LLP

[57] ABSTRACT

A method for forming field isolation regions in multilayer semiconductor devices comprises the steps of masking active regions of the substrate, forming porous silicon in the exposed field isolation regions, removing the mask and oxidizing the substrate. A light ion impurity implant is used to create pores in the substrate. Substrate oxidation proceeds by rapid thermal annealing because the increased surface area of the pores and the high reactivity of unsaturated bonds on these surfaces provides for enhanced oxidation.

32 Claims, 8 Drawing Sheets

CMOS ISOLATION UTILIZING ENHANCED OXIDATION OF RECESSED POROUS SILICON FORMED BY LIGHT ION IMPLANTATION

FIELD OF THE INVENTION

The present invention relates to field isolation of semiconductor integrated circuit devices. More specifically, the invention pertains to processes for forming field isolation regions using ion implantation to enhance silicon oxidation.

BACKGROUND OF THE INVENTION

Implementing electronic circuits involves connecting isolated devices through specific electronic paths. To fabricate an integrated circuit (IC), manufacturers isolate devices from one another within the semiconductor matrix. Subsequent interconnection of the isolated devices creates the desired circuit configurations and functionality. To reduce IC product cost, manufacturers need to pack the devices in ever closer proximity within a silicon wafer to increase the number of devices produced per silicon wafer processed. Unfortunately, the increased packing density creates larger parasitic inter-device currents resulting in degraded device performance. Device isolation technology addresses these performance issues and has thus become a critical aspect of contemporary integrated circuit fabrication.

Over the last few decades, manufacturers have developed a variety of successful isolation technologies to address the requirements of different integrated circuit types such as NMOS, CMOS, bipolar and BiCMOS. In general, the various isolation technologies exhibit different attributes with respect to such characteristics as defect density generated during isolation processing, minimum isolation spacing, surface planarity, process complexity and device performance. Moreover, manufacturers commonly trade off some of these characteristics when developing an isolation process for a particular integrated circuit application to optimize device performance, process cycle times and product cost.

In metal-oxide-semiconductor (MOS) technology, manufacturers design isolation structures to prevent parasitic channel formation between adjacent devices, such devices being primarily NMOS or PMOS transistors or CMOS circuits. LOCOS (an acronym for LOCal Oxidation of Silicon) isolation has become the most widely used isolation technology for MOS circuits. LOCOS isolation essentially involves the growth of silicon dioxide ($SiO_2$ or oxide) in field regions of the silicon substrate to produce the so-called field oxide (FOX). In LOCOS isolation, masked areas of the substrate generally define active regions, which contain the devices, and unmasked areas, which contain the inactive FOX in recessed or semirecessed structures. Manufacturers typically grow FOX to a thickness sufficient to reduce parasitic capacitance over the FOX regions while, at the same time, maintaining a desired level of surface planarity. The great success of LOCOS isolation technology is to a large extent attributed to its inherent simplicity in MOS process integration, cost effectiveness and adaptability.

In spite of its success, there are several important limitations of LOCOS technology that motivate development of improved or alternative isolation structures. Active area features defined by FOX growth often deviate from the intended structures because of nonideal LOCOS processing effects. For example, light diffraction and interference from mask edges during the photolithographic patterning process produce rounding at mask corners, an effect exacerbated by the small features found in DRAM active area arrays. Additionally, proper mask alignment is often difficult to achieve because of the nonplanar surfaces that result from LOCOS isolation structures. Mask misalignment can cause lifting and nonuniformities in isolated, narrow structures defined by the masking process. Moreover, LOCOS isolation creates oxide undergrowth, or encroachment, at the edge of the masking stack that defines the active regions of the substrate. This so-called bird's beak (as it appears in cross section) occupies a portion of the active region without providing useful device isolation and thus degrades device performance. The bird's beak similarly limits device density because it takes up active region space without providing any functionality. Moreover, bird's beak growth becomes increasingly problematic for active region features in the sub half-micron regime.

In conventional LOCOS, isolation structures are made principally from silicon dioxide by oxidizing portions of the silicon substrate. Heating the substrate for a period of time in an oxidizing ambient produces high quality thermal oxides. Unfortunately, growing silicon dioxide from a single crystal silicon substrate creates a volume expansion of the silicon dioxide layer. This volume expansion creates stress on the adjacent substrate resulting in stress-induced defects which contribute to parasitic leakage currents. The volume expansion similarly causes field oxide regions to extend above the substrate surface, compromising surface planarity for subsequent device processing. From a manufacturing viewpoint, growing high-quality, uniform silicon dioxide field isolation is a time-consuming, expensive process.

In the continuing trend toward higher density and higher performance integrated circuits, effective field isolation on submicron and nanometer scales remains one of the most difficult challenges facing semiconductor manufacturers. While conventional LOCOS processes have sufficed in the past, there remains a critical need for improved, cost-effective field isolation processes.

SUMMARY OF THE INVENTION

The present invention is a simple, efficient method for forming field isolation regions in multilayer semiconductor devices. The method comprises the steps of masking active regions of the substrate, forming porous silicon in the exposed field isolation regions, removing the mask and oxidizing the substrate. To create pores in the substrate material, the substrate receives a heavy dose of a light ion impurity at a predetermined energy. Repeated implants of several light ion impurities at different energies can be used to create an implant zone of a predetermined depth in the field isolation regions. The invention permits the use of rapid thermal annealing to substantially reduce oxidation times and encroachment. The invention also eliminates the need for chemical mechanical polishing or trench filling to improve surface planarity. To improve field oxide quality, the substrate may undergo a thermal anneal to densify the oxide layer following substrate oxidation. Similarly, subsequent processing may require removal or partial etching of the oxide layer formed over active regions during substrate oxidation. The oxide layer formed over active regions during substrate oxidation may serve additional device or processing functions. For example, this oxide layer may serve as a gate oxide layer or as a sacrificial oxide layer for a subsequent channel implant.

Moreover, an etch step immediately following the light ion implant provides for improved surface planarity. A buffer layer formed prior to masking can also be used to optimize the depthwise uniformity of the implant. A partial etch of this buffer layer prior to removing the mask allows for differential oxide growth rates between the field isolation regions and the active regions. The buffer layer is then removed from the field isolation regions prior to substrate oxidation. This permits control of the amount of recess of the final field isolation oxide resulting in substantially planar isolation regions.

DETAILED DESCRIPTION OF THE PREFERRED EMBODIMENTS

Figure 1:
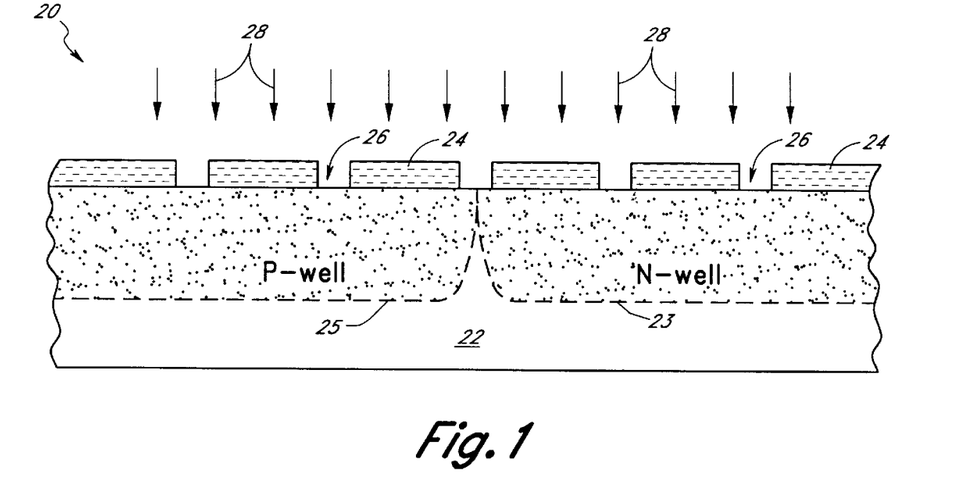
FIG. 1 is a cross sectional illustration of a semiconductor substrate prepared for the formation of porous silicon in the field isolation regions.

Referring now to FIG. 1, a semiconductor wafer 20 is ready to receive a light ion impurity implant 28. A substrate 22 has a mask 24 extending over its active regions, thereby exposing field isolation regions 26 for receiving a light ion impurity implant. The substrate 22 receives an implant of a heavy dose of a light ion impurity 28 at a predetermined energy. In some cases, the substrate 22 undergoes repeated implants of several light ion impurities at different energies to create an implant zone of a predetermined depth, typically 1500 Angstroms, in the field isolation regions 26. These light ion implants serve to create porous substrate material in the field isolation regions 26.

In one preferred embodiment, the semiconductor wafer 20 comprises a silicon substrate 22 masked with photoresist 24 over a substantially planar p-well 25 and n-well 23 structure. The substrate 22 receives a high dose Helium implant 28, typically $1 \times 10^{17}$ ions/cm$^2$ at 20 keV, to form porous silicon in the field isolation regions 26.

Figure 2:
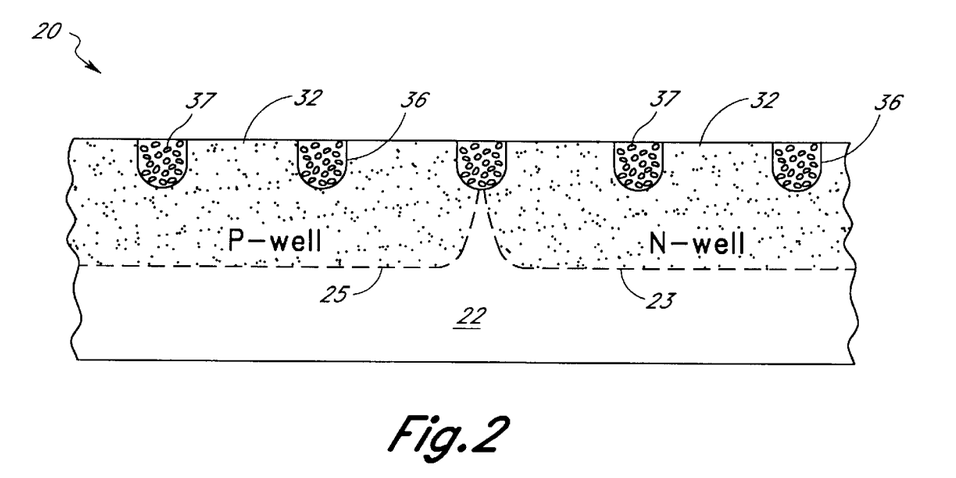
FIG. 2 is a cross sectional illustration of a semiconductor substrate after formation of porous silicon and removal of the mask.
Figure 3:
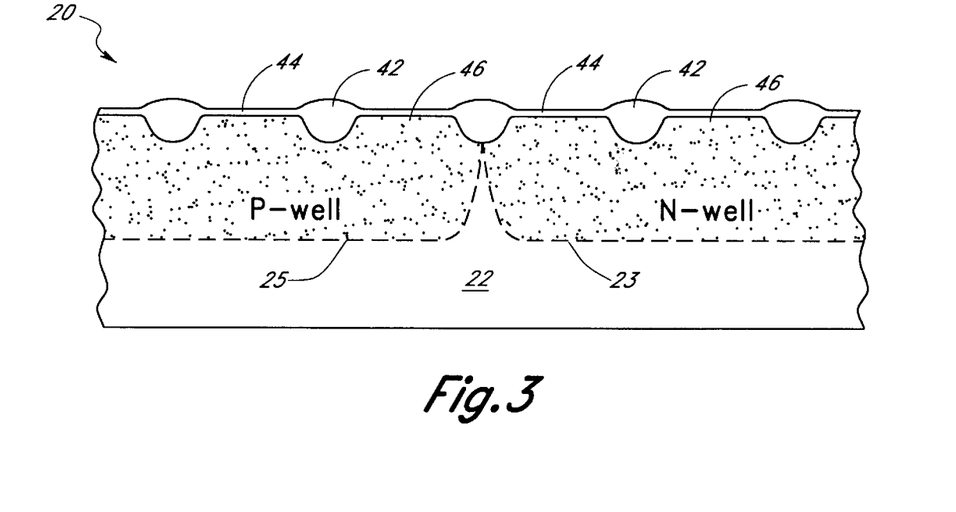
FIG. 3 is a cross sectional illustration of a semiconductor substrate after substrate oxidation.

Referring now to FIG. 2, the mask 24 (FIG. 1) has been removed from the semiconductor wafer 20 in preparation for oxidation of the substrate 22. Removing the mask exposes both porous 36 and single crystal 32 regions of the substrate 22 for subsequent oxidation. The surface of the pores 37 contain highly reactive unsaturated silicon chemical bonds that provide for enhanced oxidation. In the preferred embodiment, the silicon wafer 20 undergoes a stripping process to remove the photoresist mask 24 (FIG. 1) hardened by the prior implant. Removing the photoresist and its impurities prevents contamination of the wafer during its subsequent oxidation, for example, by rapid thermal annealing. Typically, a rapid thermal anneal occurs in a dry O$_2$ ambient at 1000 deg C. for 5 minutes. As shown in FIG. 3, enhanced oxidation occurs in the porous field isolation regions 42 because of the increased surface area of the pores 37 (FIG. 2) and the high reactivity of unsaturated silicon bonds on these surfaces. In contrast, a relatively thin layer of oxide 44 grows over the single crystal silicon in the active regions 46. At this point, the thin oxide layer 44 over the active regions 46 can, for example, function as a gate oxide or as a sacrificial oxide for a subsequent channel implant.

Figure 4:
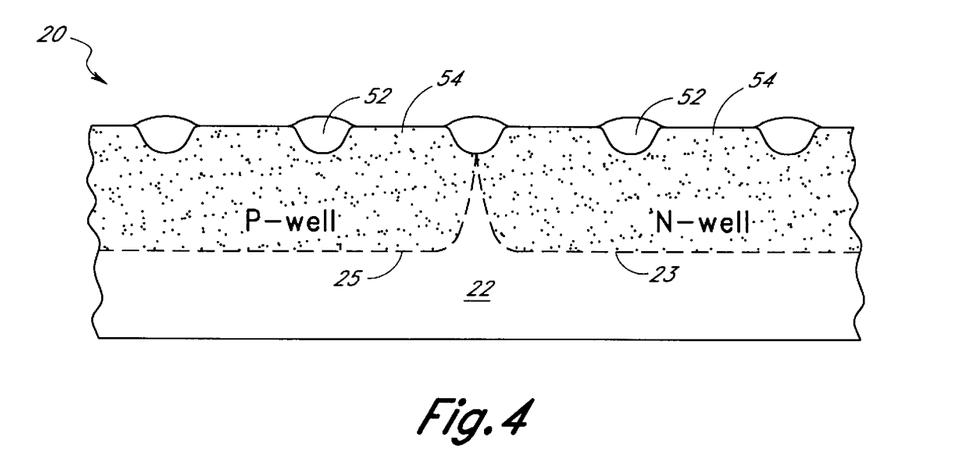
FIG. 4 is a cross sectional illustration of the semiconductor substrate of FIG. 3 after removal of the oxide layer over active regions.

To improve field oxide quality and etch rate control, the field isolation method may include an optional thermal anneal of the substrate 22 to densify the oxide layer (42, 44). In the preferred embodiment, the substrate 22 undergoes a thermal anneal at 1000 deg C. for 20 minutes in a nitrogen ambient. Removal of the thin oxide layer 44 may be necessary to expose active regions 46 for further processing. In the preferred embodiment, removal of the oxide layer 44 over the active regions 46 occurs in a 10:1 HF wet etch at 21.5 deg C. for 30 seconds. Partial removal of the thin oxide layer 44 may likewise be done by a 10:1 HF wet etch at 21.5 deg C. for less than 30 seconds if the thin oxide layer 44 is to function as a gate oxide or as a sacrificial oxide for a subsequent channel implant. FIG. 4 illustrates the structure of the field isolation regions 52 following removal of the oxide layer 44 (FIG. 3) over the active regions 54.

Figure 5:
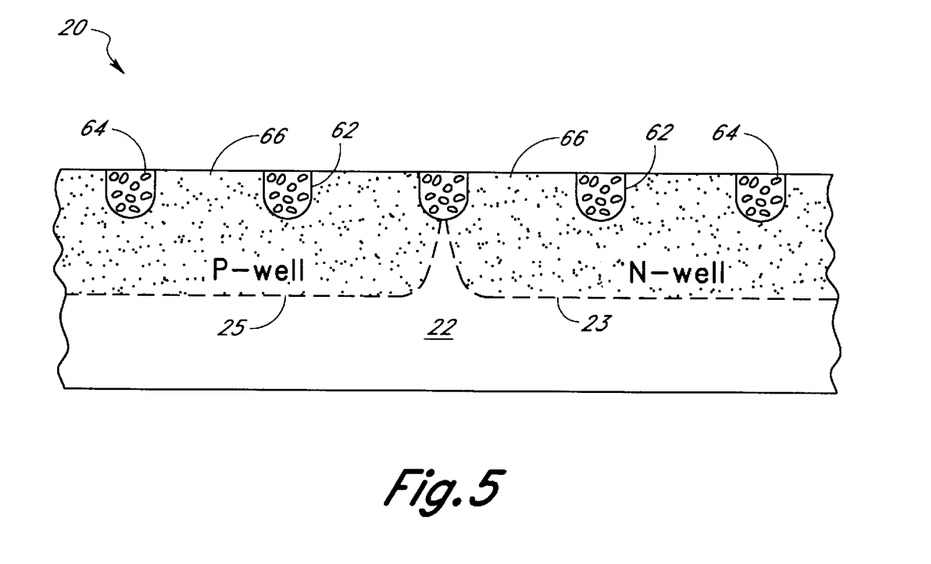
FIG. 5 is a cross sectional illustration of the semiconductor substrate of FIG. 2 after a gas phase etch.

To tailor surface topography of the substrate prior to oxidation, the field isolation method includes an etch following the light ion impurity implant. As shown in FIG. 5, a gas phase etch serves to remove some porous substrate material to thereby enlarge the pores 64 in the field isolation regions 62. In addition, the gas phase etch provides for stress relief during the subsequent oxidation. A wet etch can likewise remove porous substrate material to enlarge the pores 64 in the field isolation regions 62. In the preferred embodiment, porous silicon in the field isolation regions 62 undergoes a hydrogen down flow plasma etch inductively generated by an RF field of power between 20 watts and 100 watts, at a temperature between 400 deg C. and 600 deg C. and under a pressure of 15 mTorr for 5 minutes with the wafer 20 positioned between 20 cm and 40 cm downstream relative to the center of the plasma. In another preferred embodiment, a room temperature wet etch in 0.1% to 1.0% NH$_4$OH water solution for 1 to 10 minutes serves to enlarge the pores 64. As discussed previously, the step of oxidizing the substrate follows the step of removing the mask from the active regions 66. In the preferred embodiment, silicon oxidation occurs by rapid thermal annealing of the silicon wafer in a dry $O_2$ ambient at 1000 deg C. for about 5 minutes.

Figure 6:
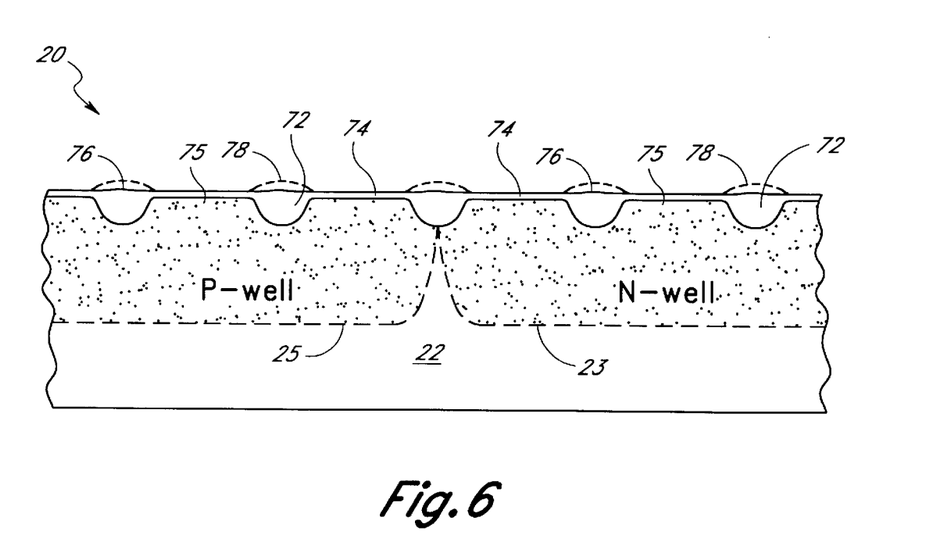
FIG. 6 is a cross sectional illustration of the semiconductor substrate of FIG. 5 after substrate oxidation.

As shown in FIG. 6, enhanced oxidation occurs in the porous field isolation regions 72 because of the increased surface area of the enlarged pores 64 (FIG. 5) and the high reactivity of unsaturated silicon bonds on these surfaces. Note, however, that following a gas phase etch of the field isolation regions 72, the surface topography 76 over the field isolation regions 72 is substantially planar as compared to the surface topography 78 that results when no etch is performed following the light ion impurity implant. As discussed previously, the oxide layer 74 over the active regions 75 can, for example, function as a gate oxide or as a sacrificial oxide for a subsequent channel implant.

Figure 7:
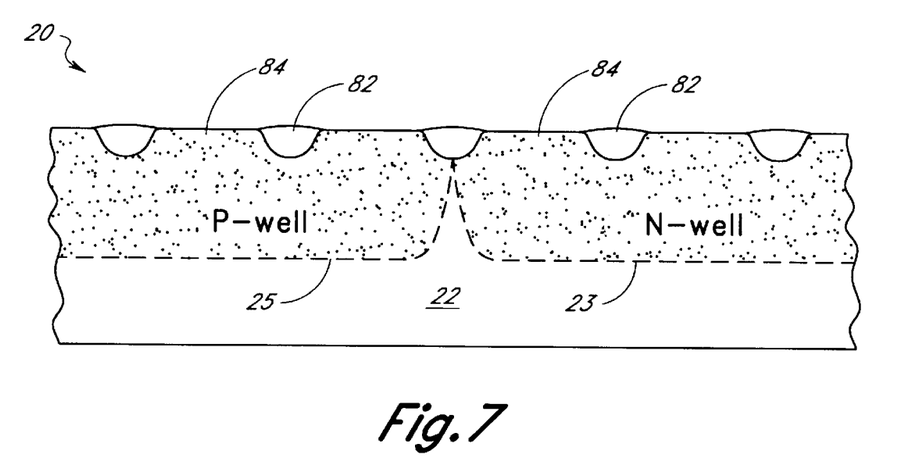
FIG. 7 is a cross sectional illustration of the semiconductor substrate of FIG. 6 after removal of the oxide layer over active regions.

To improve field oxide quality and etch rate control, the field isolation method may include an optional thermal anneal of the substrate 22 to densify the oxide layer (72, 74). In the preferred embodiment, the substrate undergoes a thermal anneal at 1000 deg C. for 20 minutes in a nitrogen ambient. Removal of the oxide layer 74 may be necessary to expose active regions 75 for further processing. In the preferred embodiment, removal of the oxide layer 74 over the active regions 75 occurs in a 10:1 HF wet etch at 21.5 deg C. for 30 seconds. Partial removal of the oxide layer (72, 74) may likewise be done by a 10:1 HF wet etch at 21.5 deg C. for less than 30 seconds if the thin oxide layer 74 is to function as a gate oxide or as a sacrificial oxide for a subsequent channel implant. FIG. 7 illustrates the structure of the field isolation regions 82 following removal of the oxide layer 74 (FIG. 6) over the active regions 84.

Figure 8:
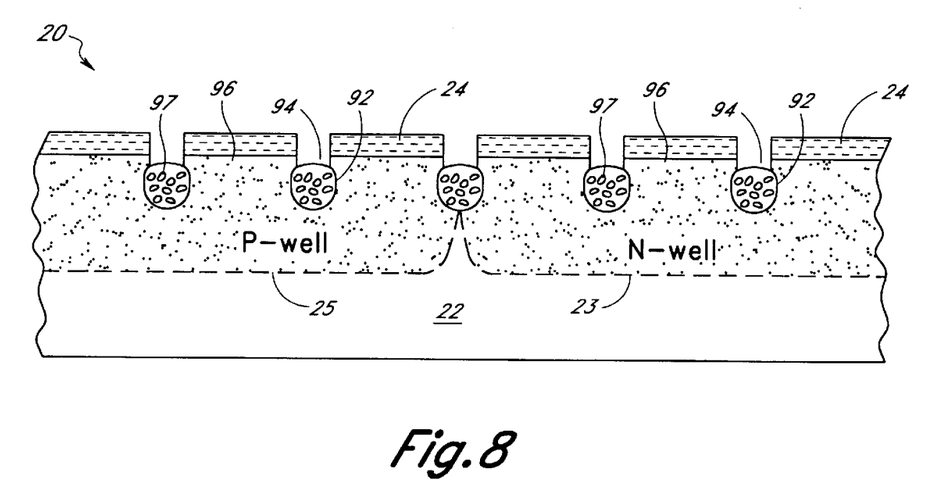
FIG. 8 is a cross sectional illustration of the semiconductor substrate of FIG. 1 after formation of porous silicon followed by a trench etch.
Figure 9:
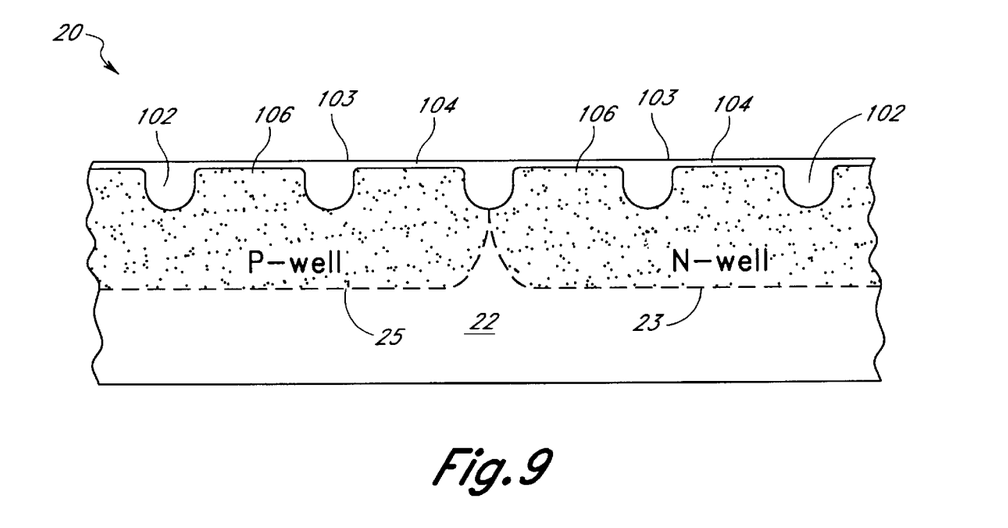
FIG. 9 is a cross sectional illustration of the semiconductor substrate of FIG. 8 after substrate oxidation.

In another preferred embodiment, prior to oxidation, the field isolation method includes a trench etch to remove non-fully porous substrate material near the field isolation region surface. FIG. 8 illustrates the trenches 94 formed by the trench etch. In the preferred embodiment, trenches are formed in the field isolation regions 92 by a $CF_4$ reactive ion etch (RIE) at room temperature, under 600 watts power and 200 mTorr pressure for 4 seconds. Substrate oxidation similarly follows the step of removing the mask 24 from the active regions 96. In the preferred embodiment, silicon oxidation occurs by rapid thermal annealing of the silicon wafer in a dry $O_2$ ambient at 1000 deg C. for 5 minutes. Enhanced oxidation again occurs in the porous field isolation regions 92 because of the increased surface area of the pores 97 and the high reactivity of unsaturated silicon bonds on these surfaces. FIG. 9 illustrates the substantially planar surface 103 over the field isolation regions 102 and the active regions 103 that results from substrate oxidation following the trench etch. As discussed previously, the oxide layer 104 over the active regions 106 can, for example, function as a gate oxide or as a sacrificial oxide for a subsequent channel implant.

Figure 10:
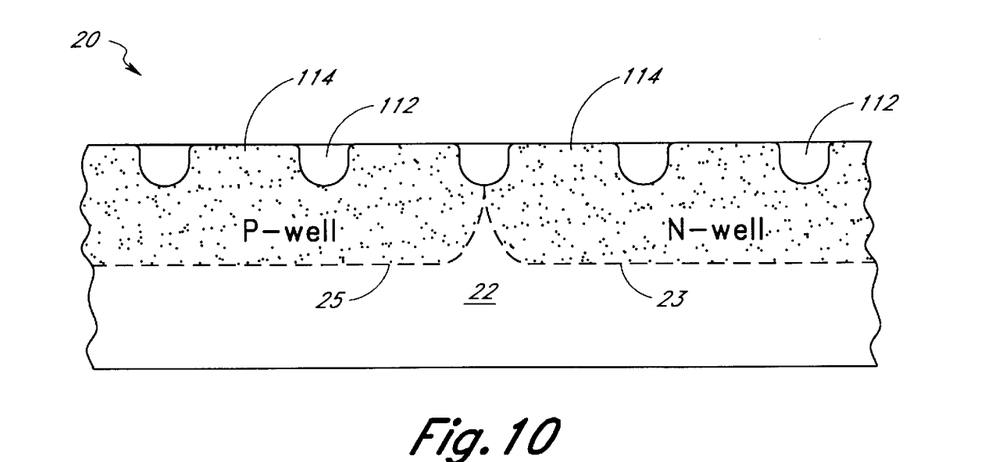
FIG. 10 is a cross sectional illustration of the semiconductor substrate of FIG. 9 after removal of the oxide layer over active regions.

To improve field oxide quality and etch rate control, the field isolation method may include an optional thermal anneal of the substrate to densify the oxide layer 104. In the preferred embodiment, the substrate undergoes a thermal anneal at 1000 deg C. for 20 minutes in a nitrogen ambient. Removal of the oxide layer 104 may be necessary to expose active regions 106 for further processing. In the preferred embodiment, removal of the oxide layer 104 over the active regions 106 occurs in a 10:1 HF wet etch at 21.5 deg C. for 30 seconds. Partial removal of the oxide layer 104 may likewise be done by a 10:1 HF wet etch at 21.5 deg C. for less than 30 seconds if the oxide layer 104 is to function as a gate oxide or as a sacrificial oxide for a subsequent channel implant. FIG. 10 illustrates the structure of the field isolation regions 112 following removal of the oxide layer 104 (FIG. 9) over the active regions 114.

Figure 11:
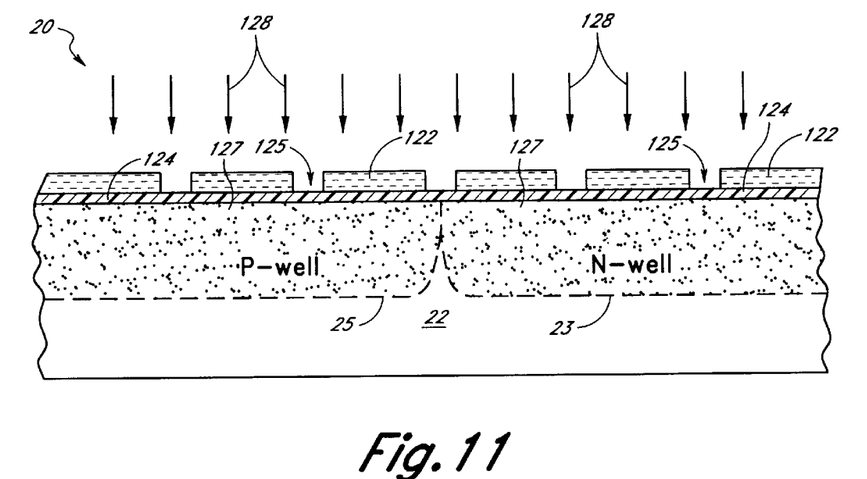
FIG. 11 is a cross sectional illustration of a semiconductor substrate after formation of a buffer layer in preparation for formation of porous silicon in the field isolation regions.
Figure 12:
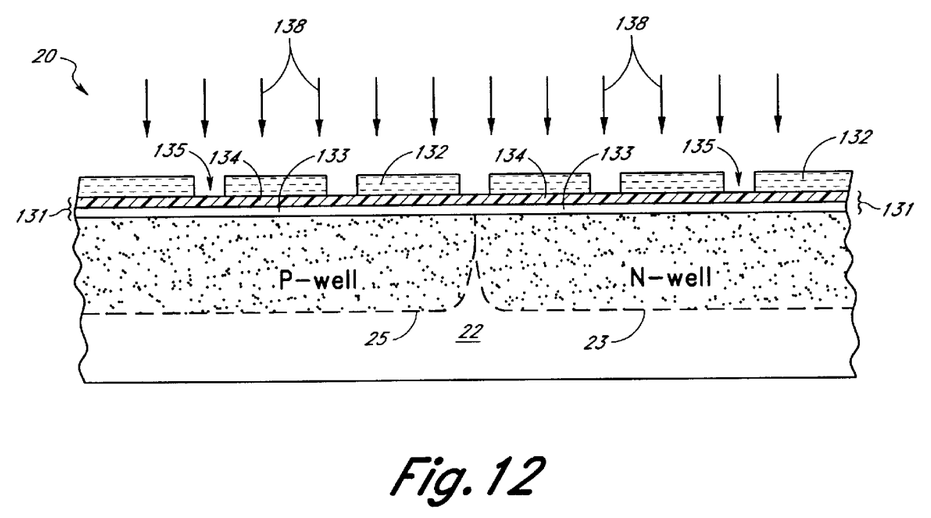
FIG. 12 is a cross sectional illustration of a semiconductor substrate after formation of a buffer layer stack in preparation for formation of porous silicon in the field isolation regions.

Referring now to FIG. 11, another preferred embodiment of the invention is illustrated wherein a semiconductor wafer 20 with an insulating buffer layer 124 is ready to receive a light ion impurity implant 128. Note that the buffer layer 124 may comprise a stack of multiple dielectrics. For example, FIG. 12 shows a buffer layer 131 having a two level stack comprising silicon dioxide 133 and silicon nitride 134. As with the embodiment described above, the substrate 22 of the embodiment in FIG. 11 has a mask 122 over its active regions 127 thereby exposing field isolation regions 125 for the light ion impurity implant. The substrate receives an implant of a heavy dose of a light ion impurity at a predetermined energy. In some cases, the substrate undergoes repeated implants of several light ion impurities at different energies to create an implant zone of a predetermined depth, typically 1500 Angstroms, in the field isolation regions. These light ion implants serve to create porous substrate material in the field isolation regions 125. The buffer layer 124 allows for optimization of the implant parameters to improve the depthwise uniformity of the porous substrate material.

In the preferred embodiment illustrated in FIG. 11, the semiconductor wafer 20 comprises a silicon substrate 22 having substantially planar p-well 25 and n-well 23 structures. An oxide buffer layer 124, typically 2000 Angstroms, is deposited over the wafer by a wet thermal oxidation at 1100 deg C. for 15 to 20 minutes. Similarly, as illustrated in FIG. 12, a buffer layer 131 having a two level stack, for example, may be formed by growing oxide of 200 Angstrom thickness by thermal oxidation in $O_2$ at 900 deg C. for 5 minutes followed by deposition of a nitride layer of 1000 Angstrom thickness by chemical vapor deposition (CVD) using $SiH_4$ and $NH_3$ at a temperature between 400 deg C. and 600 deg C. for 60 minutes. Referring again to FIG. 11, a photoresist mask 122 with openings for the field isolation regions 125 is next patterned over the buffer layer 124. The silicon substrate receives a high dose Helium implant, typically $1 \times 10^{17}$ ions/cm$^2$ at 40 keV, to form porous silicon in the field isolation regions 125.

Figure 13:
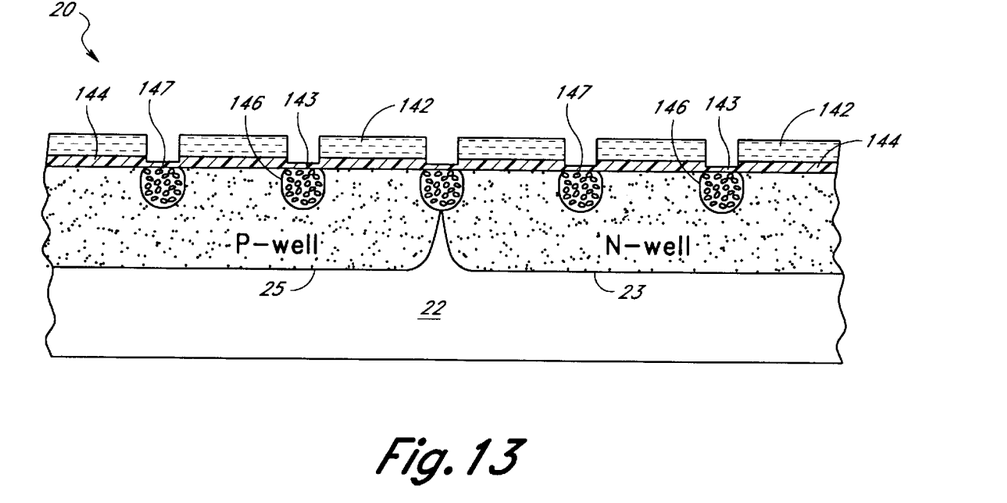
FIG. 13 is a cross sectional illustration of the semiconductor substrate of FIG. 11 after formation of porous silicon and removal of at least a portion of the buffer layer.

Referring now to FIG. 13, the semiconductor wafer 20 is prepared for oxidation by removing at least a portion of the buffer layer 144 over the field isolation regions 146. The mask 142 is then removed, followed by removal of any remaining buffer layer 143 over the field isolation regions 146. The surface of the pores 147 contain highly reactive unsaturated silicon chemical bonds that provide for enhanced oxidation. In the preferred embodiment, partial removal of 1500 Angstroms of the oxide buffer layer 144 occurs by a $CF_4$ reactive ion etch (RIE) at room temperature, under 600 watts power and 200 mTorr pressure for 4 seconds, followed by stripping of the photoresist mask 142, and then by removal of the remaining oxide buffer layer 143 over the field isolation regions 146 by a $CF_4$ reactive ion etch (RIE) at room temperature, under 600 watts power and 200 mTorr pressure until the oxide buffer layer 143 is completely removed.

In another embodiment, the entire buffer layer 144 over the field isolation regions 146 can be removed. In the preferred embodiment, a room temperature $CF_4$ reactive ion etch (RIE) under 600 watts power and 200 mTorr pressure is applied until the oxide buffer layer 144 is completely removed. The mask 142 is then removed to expose the surface over the field isolation regions 146 for further processing.

As discussed previously, an etch of the porous field isolation regions 146 can be used to tailor the surface topography of the field isolation regions 146. A gas phase etch enlarges the pores 147 and provides for stress relief during subsequent oxidation. A wet etch can likewise enlarge the pores 147 in the field isolation regions 146. In the preferred embodiment, porous silicon in the field isolation regions 146 undergoes a hydrogen down flow plasma etch inductively generated by an RF field of power between 20 watts and 100 watts, at a temperature between 400 deg C. and 600 deg C. and under a pressure of 15 mTorr for 5 minutes with the wafer 20 positioned between 20 cm and 40 cm downstream relative to the center of the plasma. In another preferred embodiment, a room temperature wet etch in 0.1% to 1.0% $NH_4OH$ water solution for 1 to 10 minutes serves to enlarge the pores 147. Similarly, a trench etch can be used to remove non-fully porous substrate material near the field isolation region surface. In the preferred embodiment, trenches are formed in the field isolation regions 146 by a $CF_4$ reactive ion etch (RIE) at room temperature, under 600 watts power and 200 mTorr pressure for 4 seconds.

Figure 14:
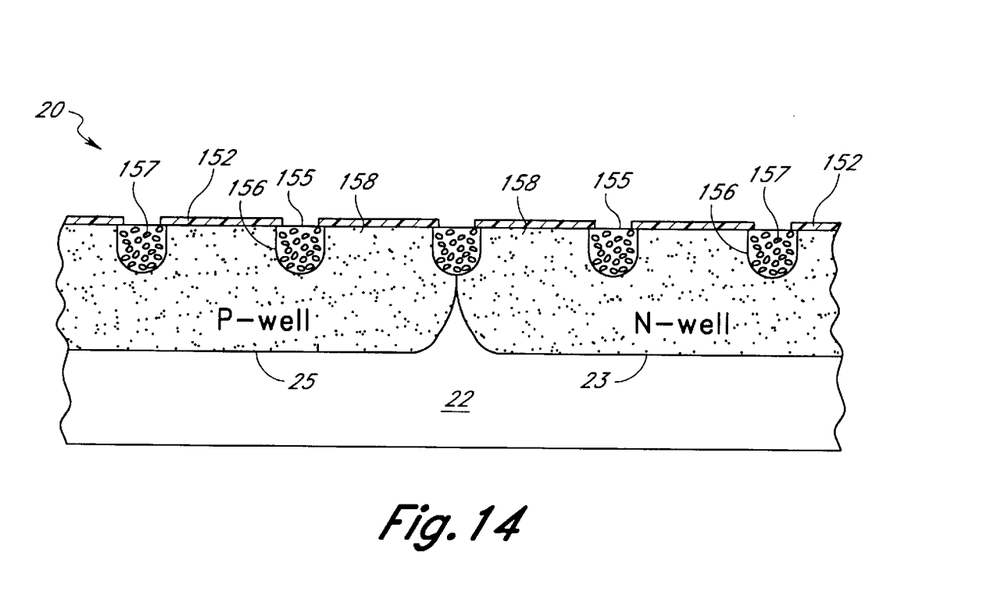
FIG. 14 is a cross sectional illustration of the semiconductor substrate of FIG. 13 after removal of the mask and removal of the buffer layer over the field isolation regions.
Figure 15:
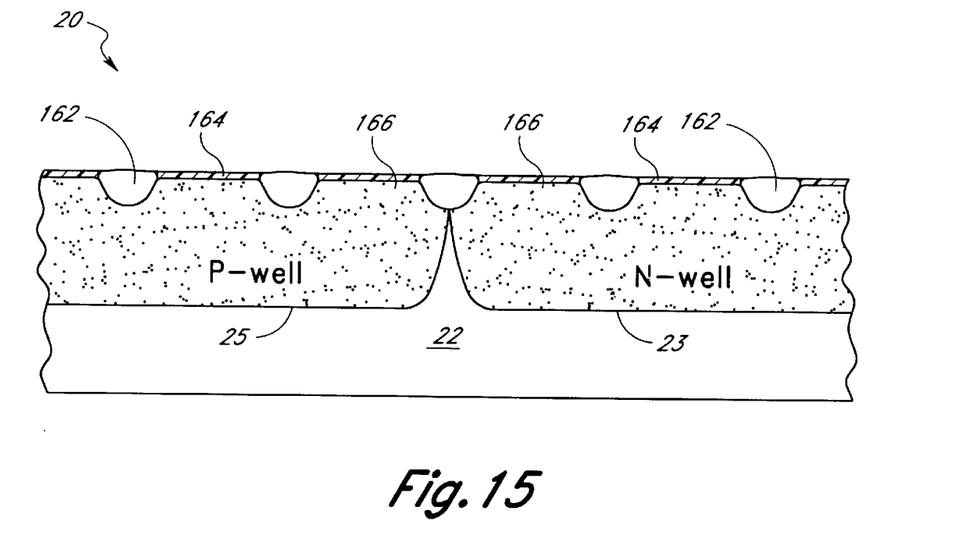
FIG. 15 is a cross sectional illustration of the semiconductor substrate of FIG. 14 after substrate oxidation.

As shown in FIG. 14, this exposes the substrate surface 155 for oxidation to form the field isolation regions 156. Note that a residual buffer layer 152 remains over active regions 158 prior to substrate oxidation. In the preferred embodiment, substrate oxidation occurs by rapid thermal annealing in a dry $O_2$ ambient at 1000 deg C. for 5 minutes. Enhanced oxidation occurs in the porous field isolation regions 156 because of the increased surface area of the pores 157 and the high reactivity of unsaturated silicon bonds on these surfaces. In contrast, negligible oxide growth occurs on the buffer layer 152 over the active regions 158. As discussed previously, the oxide buffer layer 152 over the active regions 158 can, for example, function as a gate oxide or as a sacrificial oxide for a subsequent channel implant. FIG. 15 illustrates the structure of the field isolation regions 162 and the buffer layer 164 over the active regions 166 following substrate oxidation.

Figure 16:
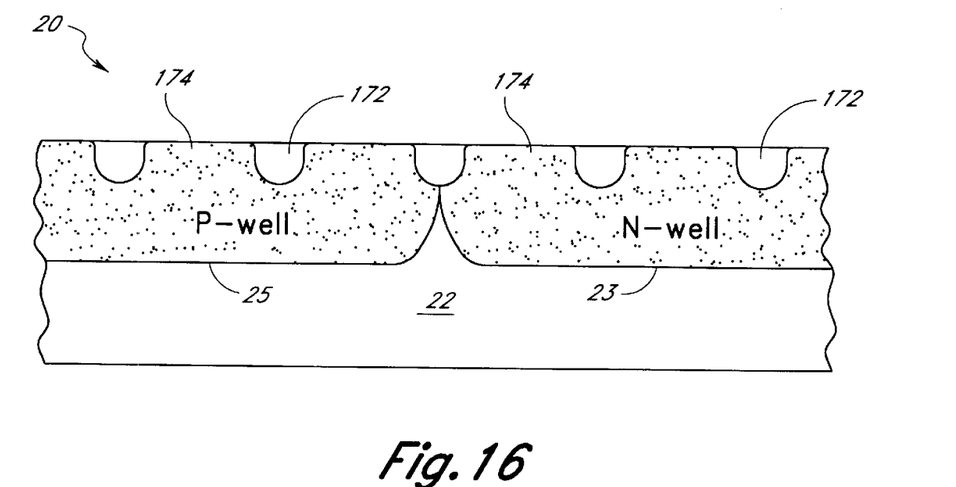
FIG. 16 is a cross sectional illustration of the semiconductor substrate of FIG. 15 after removal of the buffer layer over active regions.

To improve field oxide quality and etch rate control, the field isolation method may include an optional thermal anneal of the substrate to densify the field oxide 164. In the preferred embodiment, the substrate 22 undergoes a thermal anneal at 1000 deg C. for 20 minutes in a nitrogen ambient. Removal of the buffer layer 164 may be necessary to expose active regions 166 for further processing. In the preferred embodiment, removal of the oxide buffer layer 164 over the active regions 166 occurs in a 10:1 HF wet etch at 21.5 deg C. for 10 minutes. Partial removal of the oxide buffer layer 164 may likewise be done by a 10:1 HF wet etch at 21.5 deg C. for less than 10 minutes if the oxide buffer layer 164 is to function as a gate oxide or as a sacrificial oxide for a subsequent channel implant. FIG. 16 illustrates the structure of the field isolation regions 172 following removal of the oxide buffer layer 164 (FIG. 15) over active regions 174. As can be seen, optimization of the thickness of the buffer layer and the amount of the buffer layer partially removed can result in a substantially planar field isolation regions 172.

The present invention enables formation of deeper oxide isolation regions, as compared to those formed by LOCOS, thereby providing for improved isolation between active region devices and higher packing density. The invention likewise produces substantially planar isolation with virtually no encroachment (bird's beak) as compared to LOCOS isolation. Furthermore, the present invention allows for a shorter duration oxidation, as compared to LOCOS, thereby reducing residual stress in the isolation regions.

Moreover, the present invention provides better trench control and cross wafer uniformity as compared to existing trench isolation methods. The invention likewise eliminates the need for high aspect ratio trench filling and chemical mechanical polishing (CMP) to planarize isolation regions formed by existing trench isolation methods. Furthermore, the thermally grown oxide of the present invention is of a higher quality than the deposited oxides used in existing trench isolation methods. Finally, the present invention allows one to tailor the surface profile of the resulting isolation oxide. In contrast, existing trench isolation methods require additional processing steps, such as CMP, to obtain desired isolation regions surface profiles.

Although the disclosed invention can be generally used for device isolation functions, it can also be used to form trench structures. Here, the formation of porous silicon allows for enhanced etching and removal of material from the pores to form the trench structure. For example, the resulting trench structure can be used to form a capacitor.

Those skilled in the art may practice the principles of the present invention in other specific forms without departing from its spirit or essential characteristics. Accordingly, the disclosed embodiments of the invention are merely illustrative and do not serve to limit the scope of the invention set forth in the following claims.

What is claimed is:

1. A method for forming field isolation regions in semiconductor devices comprising the steps of:

forming a mask over active regions on said silicon substrate, the mask having openings over field isolation regions;

forming porous silicon in said field isolation regions;

etching said porous silicon;

removing said mask; and oxidizing said silicon substrate, wherein the step of etching said porous silicon comprises applying a silicon gas phase etch.

2. A method for forming field isolation regions in semiconductor devices comprising the steps of:

forming a mask over active regions on said silicon substrate, the mask having openings over field isolation regions;

forming porous silicon in said field isolation regions;

etching said porous silicon;

removing said mask; and oxidizing said silicon substrate, wherein etching said porous silicon comprises applying a silicon gas phase etch and said silicon gas phase etch comprises a down flow plasma etch.

3. The method of claim 1 wherein the step of etching said porous silicon comprises applying an anisotropic etch to improve uniformity of said porous silicon.

4. The method of claim 3 wherein said anisotropic trench etch comprises a reactive ion etch.

5. The method of claim 1 wherein forming porous silicon comprises implanting helium.

6. The method of claim 1 further comprising the step of annealing said silicon substrate.

7. The method of claim 6 wherein the step of annealing said silicon substrate comprises heating said silicon substrate in a nitrogen ambient.

8. The method of claim 1 further comprising the step of removing at least a portion of an oxide layer over said active regions.

9. A method for forming field isolation regions in semiconductor devices comprising the steps of:

forming a mask over active regions on said silicon substrate, the mask having openings over field isolation regions;

forming porous silicon in said field isolation regions;

etching said porous silicon;

removing said mask;

oxidizing said silicon substrate;

annealing said silicon substrate; and removing at least a portion of an oxide layer over said active regions, wherein the step of etching said porous silicon comprises applying a silicon gas phase etch.

10. The method of claim 9 wherein said silicon gas phase etch comprises a plasma etch.

11. The method of claim 9 wherein the step of etching said porous silicon comprises applying an anisotropic etch to improve uniformity of said porous silicon.

12. The method of claim 11 wherein said anisotropic etch comprises a reactive ion etch.

13. The method of claim 9 wherein the step of oxidizing said silicon substrate comprises oxidizing said silicon substrate in a dry oxidizing ambient.

14. The method of claim 9 wherein the step of annealing said silicon substrate comprises heating said silicon substrate in a nitrogen ambient.

15. A method for forming field isolation regions in semiconductor devices comprising the steps of:

forming a buffer layer of insulating material over a silicon substrate;

forming a mask over active regions on said silicon substrate, the mask having openings over field isolation regions;

forming porous silicon in said field isolation regions;

removing said buffer layer from said field isolation regions;

removing said mask;

oxidizing said silicon substrate, wherein the step of etching said porous silicon comprises applying a silicon gas phase etch.

16. The method of claim 15 wherein said silicon gas phase etch comprises a down flow plasma etch.

17. The method of claim 15 wherein the step of etching said porous silicon comprises applying an anisotropic silicon etch.

18. The method of claim 17 wherein said anisotropic etch comprises a reactive ion etch.

19. The method of claim 15 wherein the step of oxidizing said silicon substrate comprises oxidizing said silicon substrate in a dry oxidizing ambient.

20. The method of claim 15 further comprising the step of annealing said silicon substrate.

21. The method of claim 20 wherein the step of annealing said silicon substrate comprises heating said silicon substrate in a nitrogen ambient.

22. The method of claim 15 further comprising the step of removing at least a portion of said buffer layer over said active regions.

23. A method for forming field isolation regions in semiconductor devices comprising the steps of:

forming a buffer layer of insulating material over a silicon substrate;

forming a mask over active regions on said silicon substrate, the mask having openings over field isolation regions;

forming porous silicon in said field isolation regions;

removing said buffer layer from said field isolation regions;

removing said mask;

oxidizing said silicon substrate;

annealing said silicon substrate; and removing at least a portion of said buffer layer over said active regions, wherein, following the step of removing said mask, the method further comprises the step of etching said porous silicon.

24. The method of claim 23 wherein the step of oxidizing said silicon substrate comprises oxidizing said silicon substrate in a dry oxidizing ambient.

25. The method of claim 23 wherein the step of annealing said silicon substrate comprises heating said silicon substrate in a nitrogen ambient.

26. The method of claim 23 wherein the step of etching said porous silicon comprises applying a silicon wet etch.

27. The method of claim 23 wherein the step of etching said porous silicon comprises applying a silicon gas phase etch.

28. The method of claim 27 wherein said silicon gas phase etch comprises a down flow plasma etch.

29. The method of claim 23 wherein forming porous silicon in said field isolation regions comprises implanting helium.

30. The method of claim 29 wherein implanting helium comprises multiple implantations at different concentrations and energies prior to removing at least a portion of said buffer layer.

31. A method for forming field isolation regions in semiconductor devices comprising the steps of:

forming a buffer layer of insulating material over a silicon substrate;

forming a mask over active regions on said silicon substrate, the mask having openings over field isolation regions;

forming porous silicon in said field isolation regions;

removing said buffer layer from said field isolation regions;

removing said mask;

etching said porous silicon;

oxidizing said silicon substrate;

annealing said silicon substrate; and removing at least a portion of said buffer layer over said active regions, wherein etching said porous silicon comprises applying an anisotropic etch.

32. The method of claim 31 wherein said anisotropic etch comprises a reactive ion etch.

* * * * *